(12) United States Patent
Landa

(10) Patent No.: US 9,188,605 B2
(45) Date of Patent: Nov. 17, 2015

(54) INTEGRATED CIRCUIT (IC) TEST SOCKET WITH FARADAY CAGE

(71) Applicant: Titan Semiconductor Tool, LLC, Ladera Ranch, CA (US)

(72) Inventor: Victor Landa, Ladera Ranch, CA (US)

(73) Assignee: Xcerra Corporation, Norwood, MA (US)

( * ) Notice: Subject to any disclaimer, the term of this patent is extended or adjusted under 35 U.S.C. 154(b) by 20 days.

(21) Appl. No.: 14/078,364

(22) Filed: Nov. 12, 2013

(65) Prior Publication Data

US 2015/0130487 A1    May 14, 2015

(51) Int. Cl.
*G01R 31/00*     (2006.01)
*G01R 1/04*      (2006.01)
*G01R 1/18*      (2006.01)
*G01R 31/28*     (2006.01)

(52) U.S. Cl.
CPC ............... *G01R 1/0466* (2013.01); *G01R 1/18* (2013.01); *G01R 31/2886* (2013.01); *G01R 31/2889* (2013.01)

(58) Field of Classification Search
CPC ............... H01R 12/523; H01R 12/58; H01L 2224/48137; H01L 2924/15153; H05K 7/1084; H05K 3/3436; G01R 1/0466; G01R 1/18
USPC ............ 324/750.16, 750.27, 754.03, 750.26, 324/754.08, 756.02, 756.01, 750.25, 324/750.22, 762.02; 439/66, 68, 73, 248, 439/493, 607.1–607.59
See application file for complete search history.

(56) References Cited

U.S. PATENT DOCUMENTS

| | | | | |
|---|---|---|---|---|
| 4,515,425 A * | 5/1985 | Nakano | ............... | H05K 7/1069 439/68 |
| 4,969,828 A * | 11/1990 | Bright | ................. | G01R 1/0475 439/248 |
| 5,345,170 A * | 9/1994 | Schwindt | ................. | A46D 1/00 324/750.19 |
| 5,557,212 A * | 9/1996 | Isaac | .................... | G01R 1/0433 324/750.16 |
| 6,313,649 B2 * | 11/2001 | Harwood | ................. | 324/750.14 |
| 6,335,628 B2 * | 1/2002 | Schwindt | ................. | 324/750.19 |
| 6,409,521 B1 | 6/2002 | Rathburn | | |
| 6,486,687 B2 * | 11/2002 | Harwood | ................. | A46D 1/00 324/750.14 |
| 6,515,870 B1 * | 2/2003 | Skinner | ................. | H01L 23/552 257/691 |
| 7,026,806 B2 * | 4/2006 | Blondin | ............. | G01R 31/2886 324/750.19 |
| 7,106,050 B1 * | 9/2006 | Scranton | ................. | G01R 1/18 324/750.27 |
| 7,218,095 B2 * | 5/2007 | Hill | ......................... | G01R 1/18 174/385 |
| 7,553,189 B2 * | 6/2009 | Tseng | ................ | H01R 13/2442 439/607.14 |
| 7,737,708 B2 | 6/2010 | Sherry | | |
| 7,918,669 B1 * | 4/2011 | Tiengtum | ............ | G01R 1/0466 324/754.03 |
| 2014/0206234 A1* | 7/2014 | Mason | ............... | H01R 13/6581 439/607.35 |

\* cited by examiner

*Primary Examiner* — Patrick Assouad
*Assistant Examiner* — Sean Curtis
(74) *Attorney, Agent, or Firm* — Fulwider Patton LLP

(57) ABSTRACT

An integrated circuit test socket includes a highly conductive compliant material that is cut and installed into the test socket. The conductive material draws electrical charge away from the test socket, leading to more accurate testing. The test socket base is grounded, and a ground current runs through the base and into conductive strips. The configuration forms an electromagnetic impulse shield, protecting the chip from electromagnetic interference. The compliance of the shield material allows the shield to be sealed when activated, ensuring that the electromagnetic impulse shield is complete around the semi-conductor chip.

4 Claims, 2 Drawing Sheets

FIG. 3
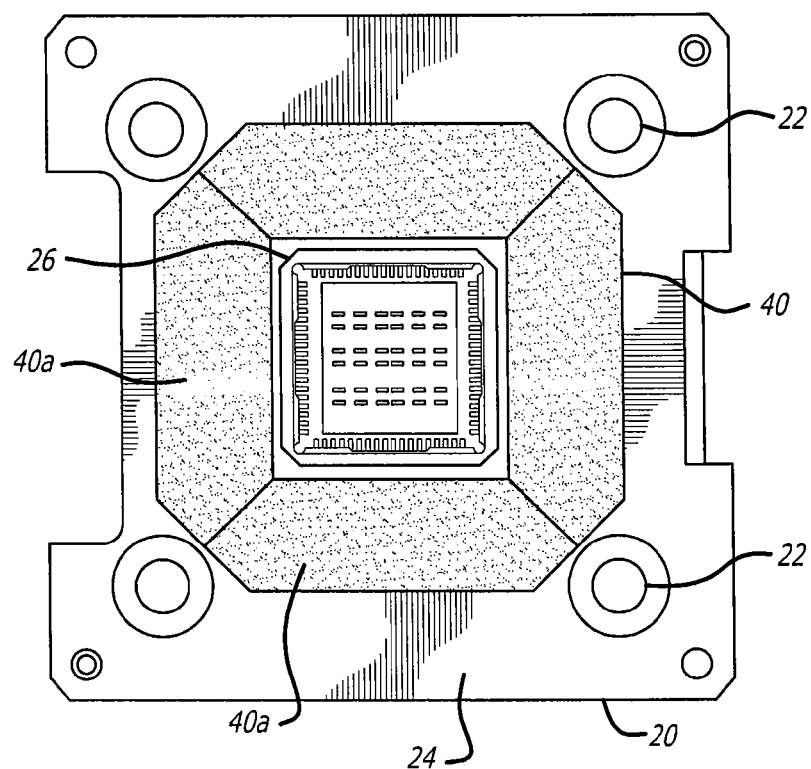
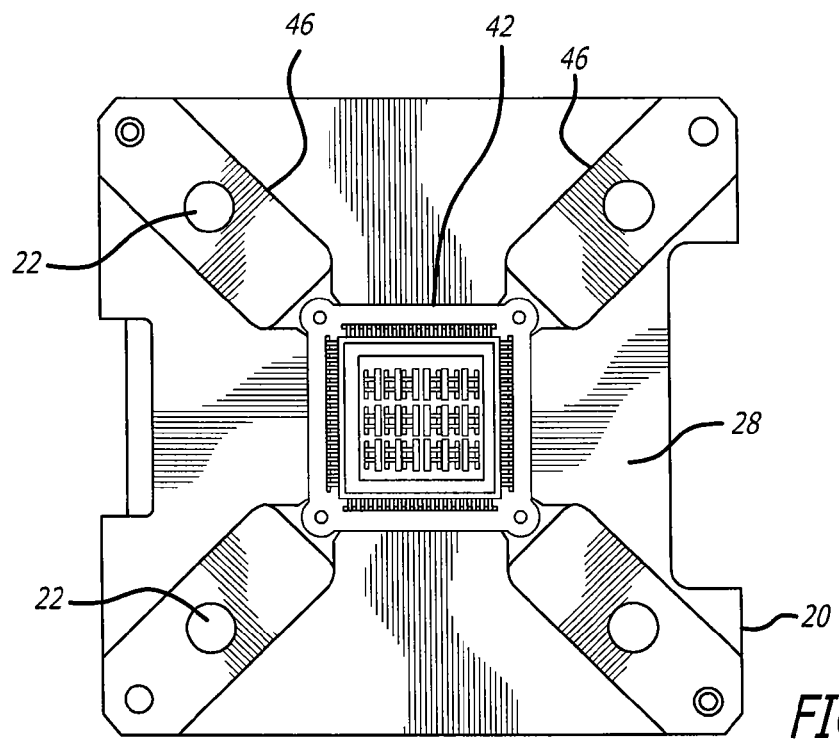
FIG. 4

INTEGRATED CIRCUIT (IC) TEST SOCKET WITH FARADAY CAGE

BACKGROUND

The present invention relates to sockets that electrically connects an integrated circuit with an IC board. More particularly, the present invention is directed to a test socket for testing an integrated circuit, wherein the test socket is enclosed in a conductive structure that acts as a faraday cage to eliminate noise and interference during the testing of an IC chip.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a handler and a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

U.S. Pat. No. 7,918,669, the contents of which are incorporated herein by reference, is a test socket devised by the present inventor. The socket of the '669 patent uses a unique linkage to urge the connectors of the test circuit upward where it can make contact with the test equipment. This test socket was found to be very successful in ensuring good contact with the test apparatus while reducing force on the circuit itself. A component of that test socket was an elastomer element that provided a resiliency to the link, ensuring proper contact in a cost effective and reliable manner. The cylindrical elastomer keeps the contact links in place, and their resiliency acts like a spring mechanism for the links. This allows for vertical movement on the link.

When such test sockets are used, it is common for small amounts of static charge to build up on the socket, which can affect the results of the testing. Charged test sockets can transfer their charge to the circuit under test, which then leads to noise being introduced into the testing. Noise in the testing impairs the ability of the tester to evaluate the integrated circuit properly. Accordingly, the present invention is designed to reduce or eliminate the build-up of electrical charge on the test socket, leading to more accurate test results.

SUMMARY OF THE INVENTION

The present invention is directed to an integrated circuit test socket that includes a highly conductive compliant material that is cut and installed into the test socket. The conductive material draws electrical charge away from the test socket, leading to more accurate testing. In a preferred embodiment, the test socket base is grounded, and a ground current runs through the base and into conductive strips. The configuration forms an electromagnetic impulse shield, protecting the chip from electromagnetic interference. The compliance of the shield material allows the shield to be sealed when activated, ensuring that the electromagnetic impulse shield is complete around the semi-conductor chip.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

BRIEF DESCRIPTION OF THE DRAWINGS

FIG. 3 is a top view of the test socket of FIG. 1; and

FIG. 4 is a bottom view of the test socket of FIG. 1.

DETAILED DESCRIPTION OF THE PREFERRED EMBODIMENTS

Figure 1:
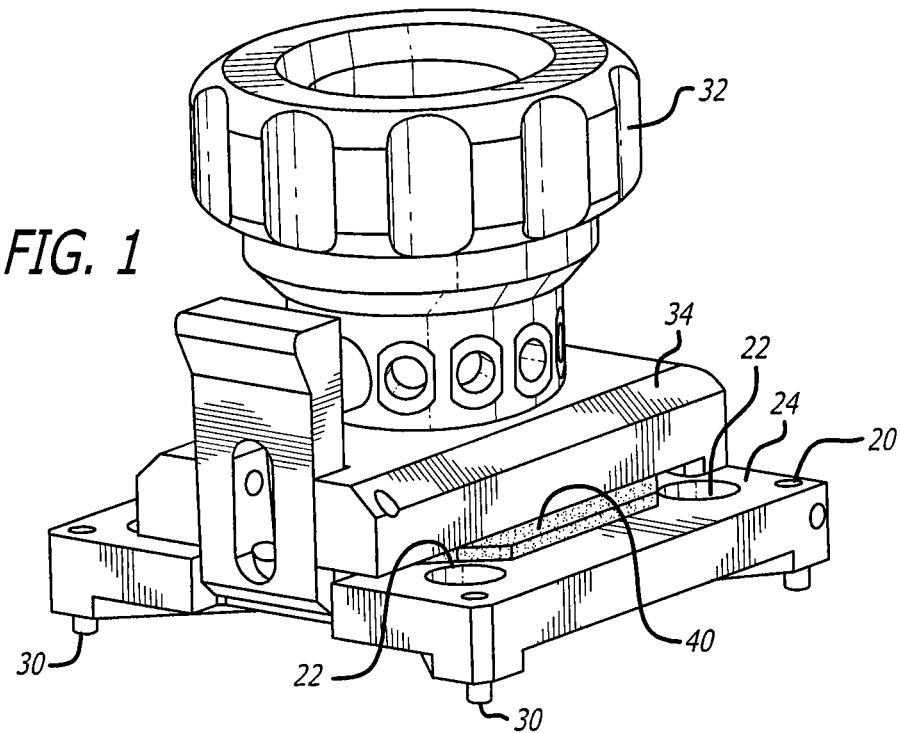
FIG. 1 is an elevated, perspective view of an embodiment of the test socket and testing apparatus.
Figure 2:
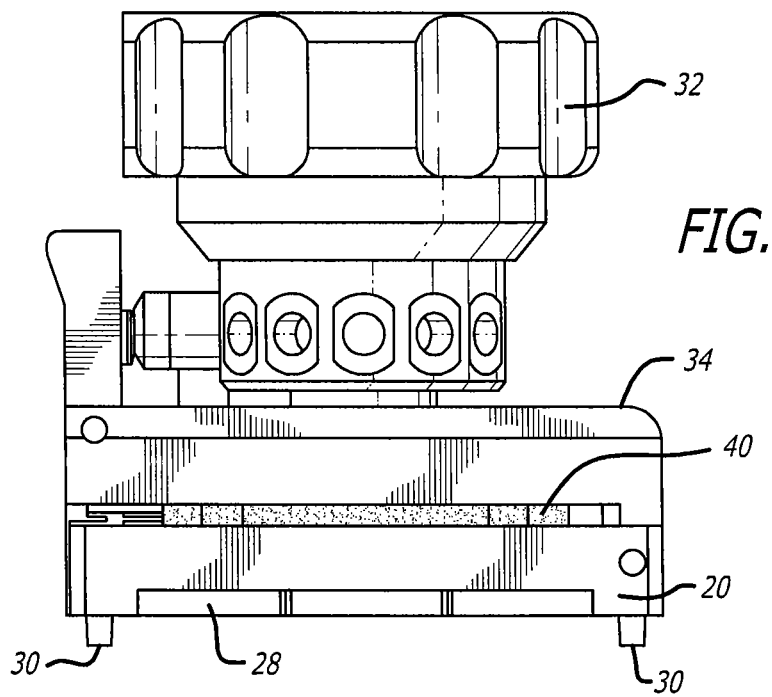
FIG. 2 is a side view of the socket and testing apparatus of FIG. 1.

FIGS. 1 and 2 illustrate an integrated circuit test socket 20 of the type generally described in U.S. Pat. No. 7,918,669, the contents of which are incorporated herein. The details of the test socket is omitted herein for brevity. The test socket base 20 has a generally square profile with four aligning holes 22 to mount the socket base on the testing equipment. On a lower surface 28 of the base 20, a set of pegs 30 may be used to further align and set the base on the test equipment. On an upper surface 24 of the test socket base 20 (see FIG. 3), a square recess 26 is formed to receive the integrated circuit chip (not shown) under test. A plurality of electrical connectors are formed within the recess 26 as described more fully in the patent referenced above. Once the integrated circuit is placed in the recess, the test socket base 20 may be placed, for example, in a handler work press 32 and clamped in the handler 32 in anticipation of testing the integrated chip. The handler/work press 32 utilizes a clamping plate 34, where the clamping plate 34 encloses the chip under test. Other arrangements, both automated and manual, are also possible with the present invention.

A Faraday cage is a container or enclosure made of conducting material, such as wire mesh or metal plates, that shields what it encloses from external electric fields. In chip testing, static charge on the socket and surrounding elements generate external electromagnetic interference (EMI, or noise) that can interfere with the test results. The present invention forms a Faraday cage around the chip under test to shield the chip from EMI and noise during the testing.

Turning to FIG. 3, an EMI shield 40 is formed on the socket base 20 such that it is wedged between the base 20 and the clamp plate 34. The shield is made if a conductive material and may be a mesh or solid thin plate. The cage may be adhered to the top surface 24 of the base 20 by insertion into a groove, by adhesive, by fastener, or by other means.

FIG. 4 illustrates the bottom surface 28 of the socket base 20, including the test socket 42 connected to four diagonal members 46. The four diagonal members 46 on the bottom of the base 20 make contact with the printed circuit board. The corresponding paths on the printed circuit board are grounded. This ground current runs through the base and into the EMI shield. The shield serves as a mini-faraday cage for the device, shielding the device with the conductive socket shield grounded to the printed circuit board.

The conductive shield 40 is preferably formed as part of the socket base 20. In other words, the socket may be constructed to include the shield 40, the chip test socket 42, and the base 20 as a single piece, and together these components cooperate to constitute the integrated shield. Further, the contact footprint of the socket base 20 to the printed circuit board is defined by the grounding requirements of the application.

The shield 40 can be constructed of four discrete plates 40a or meshes that are placed in a recess sized to hold the plates. The four plates 40a cooperate to form an octagon above and around the square recess 26, so that the clamp 34 contacts the upper surface of the shield 40.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

I claim:

1. A test socket for a microchip, comprising:
   a base including a plurality of aligning through holes for securing the base to a handler, the base further comprising a chip test socket and a shield comprising four adjoining plates surrounding the test socket, each plate including a pair of edges aligned parallel to the test socket and a pair of edges aligned diagonally to the test socket;
   wherein the shield is entirely disposed on top of the base and is sandwiched between the base and a clamp plate when placed in a tester; and
   wherein the base, shield, and test socket are integrated as a single unit.

2. The test socket of claim 1, wherein the shield is octagonal shaped.

3. The test socket of claim 1, wherein the shield is made of a metal mesh.

4. The test socket of claim 1, wherein the base and the shield form a Faraday cage about the microchip when the base is seated on a grounded circuit board.

* * * * *